United States Patent
Flachowsky et al.

(10) Patent No.: US 8,536,034 B2
(45) Date of Patent: Sep. 17, 2013

(54) METHODS OF FORMING STRESSED SILICON-CARBON AREAS IN AN NMOS TRANSISTOR

(75) Inventors: Stefan Flachowsky, Dresden (DE); Ralf Illgen, Dresden (DE); Thilo Scheiper, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 56 days.

(21) Appl. No.: 13/216,921

(22) Filed: Aug. 24, 2011

(65) Prior Publication Data
US 2013/0052783 A1 Feb. 28, 2013

(51) Int. Cl.
*H01L 21/425* (2006.01)
(52) U.S. Cl.
USPC .................................. 438/530; 257/E21.334
(58) Field of Classification Search
USPC ........................... 438/303, 530; 257/E21.334
See application file for complete search history.

(56) References Cited

U.S. PATENT DOCUMENTS

| 6,989,332 B1* | 1/2006 | Bell et al. ...................... 438/719 |
| 7,560,327 B2 | 7/2009 | Kim et al. |
| 2009/0181508 A1* | 7/2009 | Holt et al. ...................... 438/285 |
| 2011/0133189 A1* | 6/2011 | Yang et al. ...................... 257/57 |
| 2012/0068193 A1* | 3/2012 | Chan et al. ...................... 257/77 |

OTHER PUBLICATIONS

STIC search report, May 17, 2013.*

* cited by examiner

*Primary Examiner* — William D Coleman
*Assistant Examiner* — Christine Enad
(74) *Attorney, Agent, or Firm* — Williams, Morgan & Amerson, P.C.

(57) ABSTRACT

Disclosed herein are various methods of forming stressed silicon-carbon areas in an NMOS transistor device. In one example, a method disclosed herein includes forming a layer of amorphous carbon above a surface of a semiconducting substrate comprising a plurality of N-doped regions and performing an ion implantation process on the layer of amorphous carbon to dislodge carbon atoms from the layer of amorphous carbon and to drive the dislodged carbon atoms into the N-doped regions in the substrate.

20 Claims, 3 Drawing Sheets

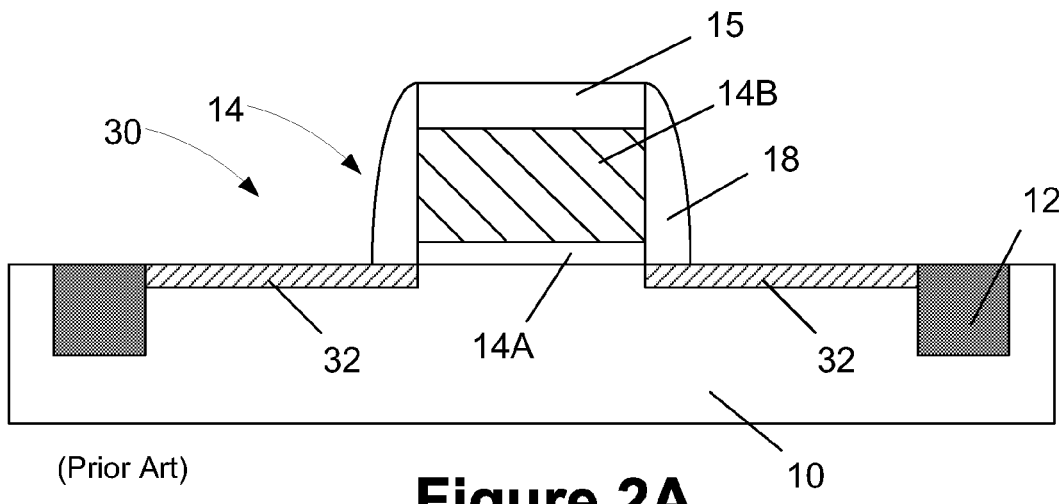
(Prior Art) Figure 2A
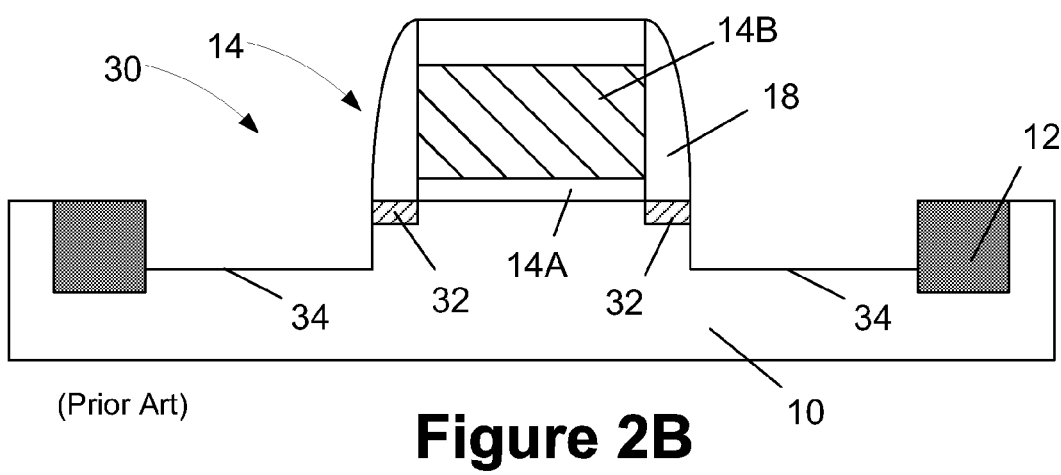
(Prior Art) Figure 2B
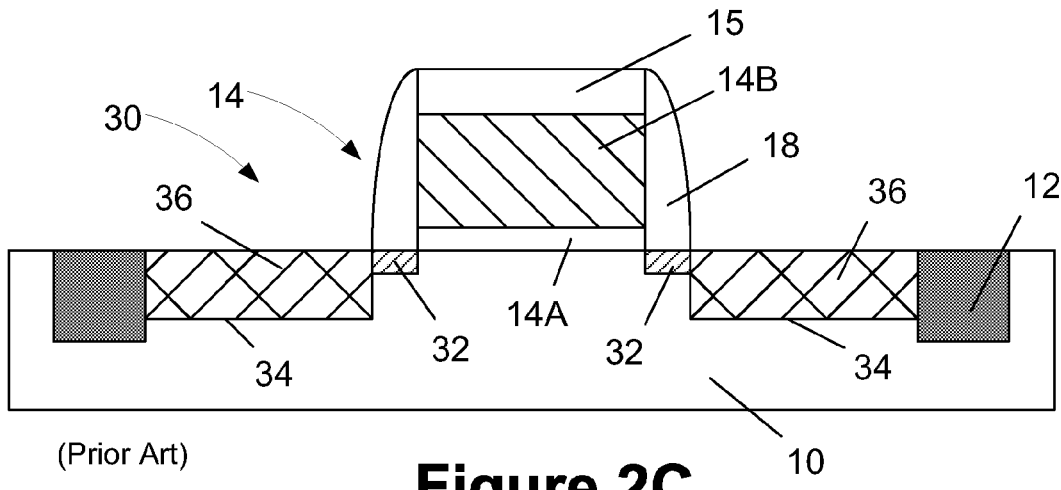
(Prior Art) Figure 2C

METHODS OF FORMING STRESSED SILICON-CARBON AREAS IN AN NMOS TRANSISTOR

BACKGROUND OF THE INVENTION

1. Field of the Invention

Generally, the present disclosure relates to the manufacturing of sophisticated semiconductor devices, and, more specifically, to various methods of forming stressed silicon-carbon areas in an NMOS transistor device.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit elements that substantially determine performance of the integrated circuits. During the fabrication of complex integrated circuits using, for instance, MOS technology, millions of transistors, e.g., NMOS transistors and/or PMOS transistors are formed on a substrate including a crystalline semiconductor layer. A field effect transistor, irrespective of whether an NMOS transistor or a PMOS transistor is considered, typically comprises so-called PN junctions that are formed by an interface of highly doped regions, referred to as drain and source regions, with a slightly doped or non-doped region, such as a channel region, disposed between the highly doped regions source/drain regions.

Device designers are under constant pressure to improve the electrical performance characteristics of semiconductor devices, such as transistors, and the overall performance capabilities of integrated circuit devices that incorporate such devices. One technique that has been and continues to be employed to improve the performance of such transistors is to reduce or scale the channel length of such transistors. As device dimensions have decreased, device designers have resorted to other techniques to improve device performance. One such method involves the use of channel stress engineering techniques on transistors to create a tensile stress in the channel region for NMOS transistors and to create a compressive stress in the channel region for PMOS transistors. These stress conditions improve charge carrier mobility of the devices—electrons for NMOS devices and holes for PMOS devices. Additional stress engineering techniques for PMOS transistors may also involve the formation of eptaxially-deposited silicon-germanium source/drain regions, and the formation of an epitaxially-deposited silicon-germanium layer under in the channel region of the PMOS device. Additional stress engineering techniques that have been performed on NMOS transistors includes the formation of silicon-carbon source-drain regions to induce a desired tensile stress in the channel region of the NMOS transistor, as discussed more fully below.

One illustrative prior art technique for forming silicon-carbon, tensile stress-inducing regions in an NMOS transistor will now be described with reference to FIGS. 1A-1C. FIG. 1A depicts an illustrative NMOS transistor 30 at an early stage of fabrication wherein a gate electrode structure 14 has been formed above a semiconducting substrate 10 in an active region that is defined by a shallow trench isolation structure 12. The gate electrode structure 14 typically includes a gate insulation layer 14A and a conductive gate electrode 14B. An illustrative gate cap layer 15 is formed above the gate electrode 14B, and illustrative sidewall spacers 18 are also formed proximate the gate electrode structure 14. To arrive at the structure depicted in FIG. 1A, the gate electrode structure 14 and the gate cap layer 15 are typically formed by depositing various layers of material and performing one or more etching processes to define the basic stack of materials shown in FIG. 1A. Thereafter, an initial ion implantation process is typically performed to form so-called extension implant regions 16 in the substrate 10. Then, the sidewall spacers 18 are formed proximate the gate electrode structure 14 by depositing a layer of spacer material and thereafter performing an anisotropic etching process. After the spacers 18 are formed, a second ion implantation process is then performed on the transistor 30 to form so-called deep source-drain implant regions 20 in the substrate 10. The ion implantation process performed to form the deep source-drain implant regions 20 is typically performed using a higher dopant dose and it is performed at higher implant energy than the ion implantation process that was performed to form the extension implant regions 16. The above referenced implantation processes are performed using N-type dopants for the NMOS transistor 30. Other implant regions, such as so-called halo implant regions (not shown) have also been formed in the substrate 10 at the point of fabrication depicted in FIG. 1A. Thereafter, as shown in FIG. 1A, an ion implantation process 23 is performed to amorphize at least a portion of the area of the substrate 10 where the final source drain regions of the transistor 30 will be formed. This amorphization implant process 23 may be performed using xenon, germanium, etc. ions at a dose and energy level to sufficient to cause damage to the lattice structure of the substrate 10 in an effort to make the substrate 10 more receptive to carbon ions that will be subsequently implanted into the substrate 10 in the amorphized areas.

Next, as shown in FIG. 1B, an ion implantation process 25 is performed using carbon ions to implant the carbon ions in the source/drain areas of the substrate 10. The ion implant process 25 may typically be performed with a dose of $1\text{-}5\,e^{15}$ atoms/cm$^2$ carbon atoms at an energy level of approximately 1-5 keV. The various implantation processes described with respect to FIGS. 1A-1C may be performed using well-known methods, and well-known ion implantation systems.

Thereafter, as shown in FIG. 1C, a heating or anneal process 27 is performed to form the final source drain regions 29 for the NMOS transistor 30 that are comprised of, at least in part, silicon-carbon material. The heating process 27 repairs the damage to the lattice structure of the substrate material as a result of the implantation processes and it activates the implanted dopant materials, i.e., the implanted carbon and N-type dopant materials are incorporated into the silicon lattice.

Another illustrative prior art technique for forming silicon-carbon, tensile stress-inducing regions in an NMOS transistor will now be described with reference to FIGS. 2A-2C. FIG. 2A depicts the illustrative NMOS transistor 30 at an early stage of fabrication, wherein the gate electrode structure 14 has been formed above the semiconducting substrate 10. As noted previously, the gate electrode structure 14 typically includes a gate insulation layer 14A and a conductive gate electrode 14B. An illustrative gate cap layer 15 is formed above the gate electrode 14B, and illustrative sidewall spacers 18 are also formed proximate the gate electrode structure 14, just as described above with reference to FIGS. 1A-1C. An illustrative extension implant region 32 that is formed in the substrate 10 is also depicted in FIG. 2A. As discussed previously with respect to FIGS. 1A-1C, to arrive at the structure depicted in FIG. 2A, the gate electrode structure 14 and the gate cap layer 15 are typically formed by depositing various layers of material and performing one or more etching processes to define the basic stack of materials shown in FIG. 2A.

Thereafter, an initial ion implantation process with an N-type dopant, e.g., arsenic, is typically performed to form the extension implant regions 32 in the substrate 10. Other implant regions, such as so-called halo implant regions (not shown) have also be previously formed in the substrate 10 at the point of fabrication depicted in FIG. 2A. Then, the sidewall spacers 18 are formed proximate the gate electrode structure 14 by depositing a layer of spacer material and thereafter performing an anisotropic etching process.

Next, as shown in FIG. 2B, after the spacers 18 are formed, an etching process is performed to form recesses 34 in the substrate 10. The masking layer used during the etching process that is performed to define the recesses 34 is not depicted in the drawings. Then, as shown in FIG. 3C, an epitaxial deposition process is performed to form epitaxial silicon-carbon regions 36 in the cavities 34. In this technique, carbon atoms are introduced in situ during the epitaxial deposition process. After the epitaxial silicon-carbon regions 36 are formed, a second ion implantation process is then performed on the transistor 30 to form so-called deep source-drain implant regions (not shown) in the substrate 10. Thereafter, a heating or anneal process is performed to form the final source drain regions (not shown) for the NMOS transistor 30.

The tensile stress created by the silicon-carbon regions is created because a carbon atom is smaller than a silicon atom. Thus, when the carbon atoms are incorporated into the silicon lattice structure, the material exhibits a desirable tensile stress, at least a portion of which is transferred to the channel region of the NMOS transistor. Unfortunately, using the prior art techniques described above, the amount of carbon that can be introduced into the silicon material is limited, i.e., carbon content is limited to about 1-2%. Such low levels of carbon make it difficult to create a significant tensile stress level in the resulting material, thereby limiting the effectiveness of silicon-carbon material to impart the desired levels of tensile stress on the channel region of an NMOS transistor.

The present disclosure is directed to various methods of forming stressed silicon-carbon areas in an NMOS transistor device that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming stressed silicon-carbon areas in an NMOS transistor device. In one example, a method disclosed herein includes forming a layer of amorphous carbon above a surface of a semiconducting substrate comprising a plurality of N-doped regions and performing an ion implantation process on the layer of amorphous carbon to dislodge carbon atoms from the layer of amorphous carbon and to drive the dislodged carbon atoms into the N-doped regions in the substrate.

In another illustrative example, a method disclosed herein includes forming a layer of amorphous carbon above a plurality of N-doped regions formed in a semiconducting substrate, performing an ion implantation process on the layer of amorphous carbon to dislodge carbon atoms from the layer of amorphous carbon and to drive said dislodge the carbon atoms into the plurality of N-doped regions and performing an anneal process on the substrate to form final source/drain regions for an NMOS transistor, wherein the source/drain regions comprise a silicon-carbon material.

Yet another illustrative method includes forming a gate electrode structure for an NMOS transistor above a surface of semiconducting substrate and forming a plurality of N-doped implant regions in the substrate proximate the gate electrode structure. The method further involves forming a layer of amorphous carbon above the N-doped regions and performing an ion implantation process on the layer of amorphous carbon to dislodge carbon atoms from the layer of amorphous carbon and to drive the dislodged carbon atoms into the N-doped regions in the substrate.

BRIEF DESCRIPTION OF THE DRAWINGS

The disclosure may be understood by reference to the following description taken in conjunction with the accompanying drawings, in which like reference numerals identify like elements, and in which:

FIG. 2A-2C depicts another illustrative prior art process flow for forming silicon-carbon regions for an NMOS transistor semiconductor device.

Figure 1A:
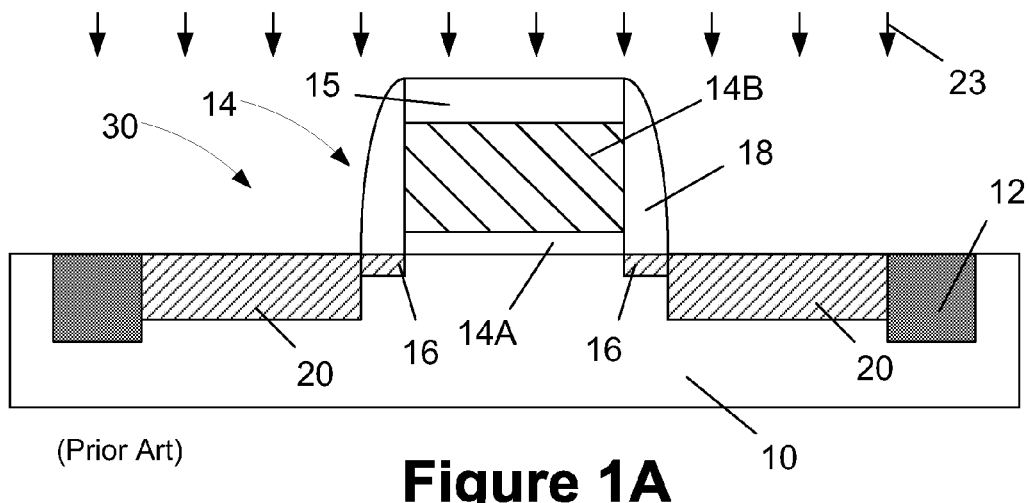
FIGS. 1A-1C depicts one illustrative prior art process flow for forming silicon-carbon regions for an NMOS transistor semiconductor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 3A:
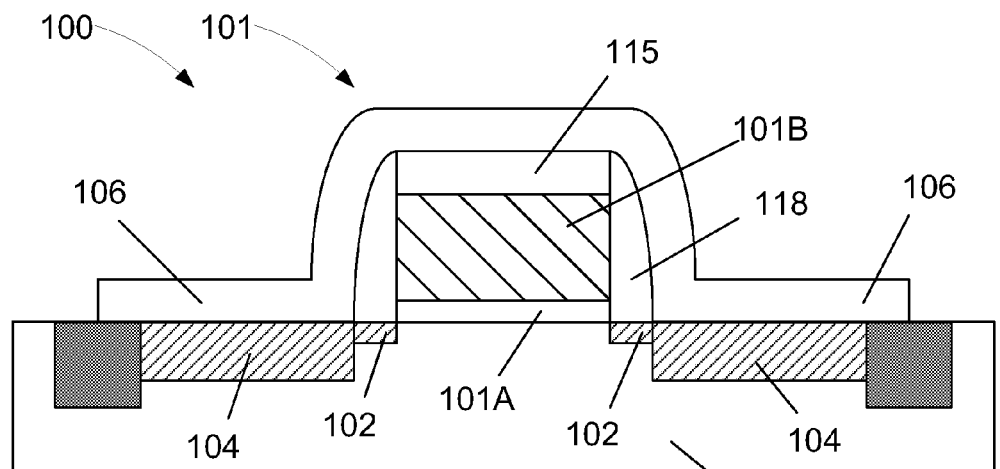
FIGS. 3A-3C depict various illustrative novel methods described herein for forming stressed silicon-carbon areas in an NMOS transistor device.
Figure 3B:
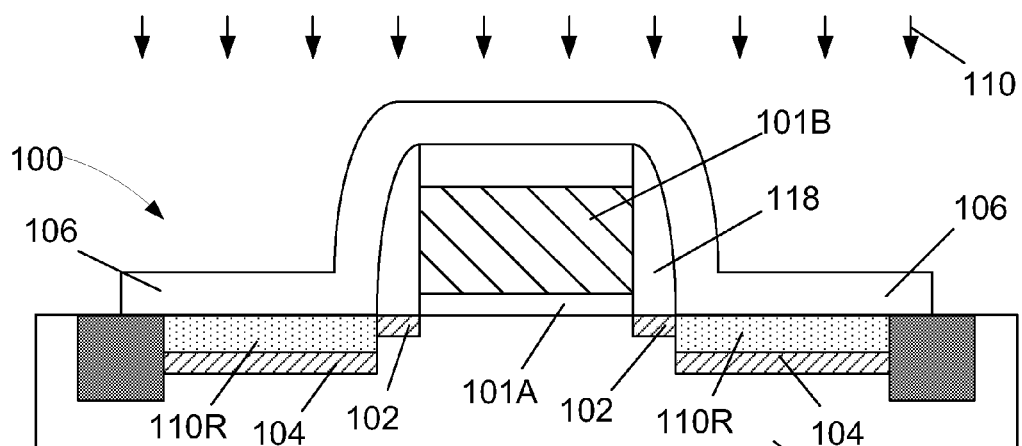
Figure 3C:
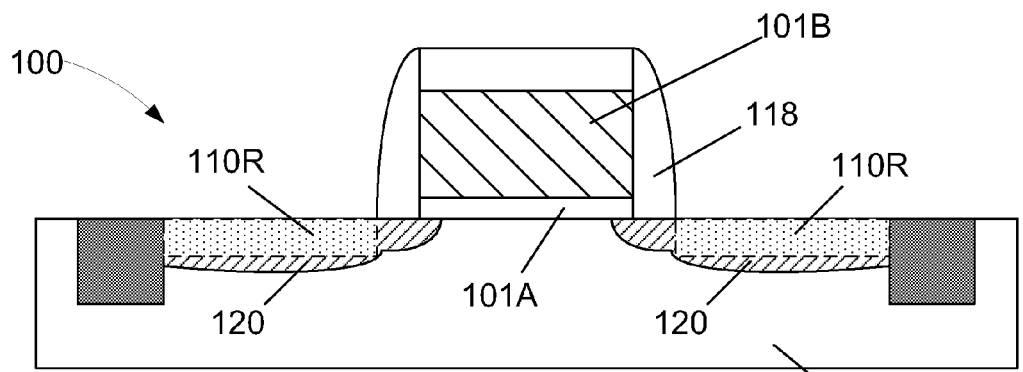

The present disclosure is directed to various methods of forming stressed silicon-carbon areas in an NMOS transistor device. As will be readily apparent to those skilled in the art upon a complete reading of the present application, the present methods and systems are applicable to a variety of technologies, e.g., NMOS, CMOS, etc., and they are readily applicable to a variety of devices, including, but not limited to, logic devices, memory devices, etc. With reference to FIGS. 3A-3C, various illustrative embodiments of the methods disclosed herein will now be described in more detail. Various masking layers that would be used during the implantation processes discussed in connection with FIGS. 3A-3C are not depicted in the drawings so as not to obscure the present inventions.

Figure 1B:
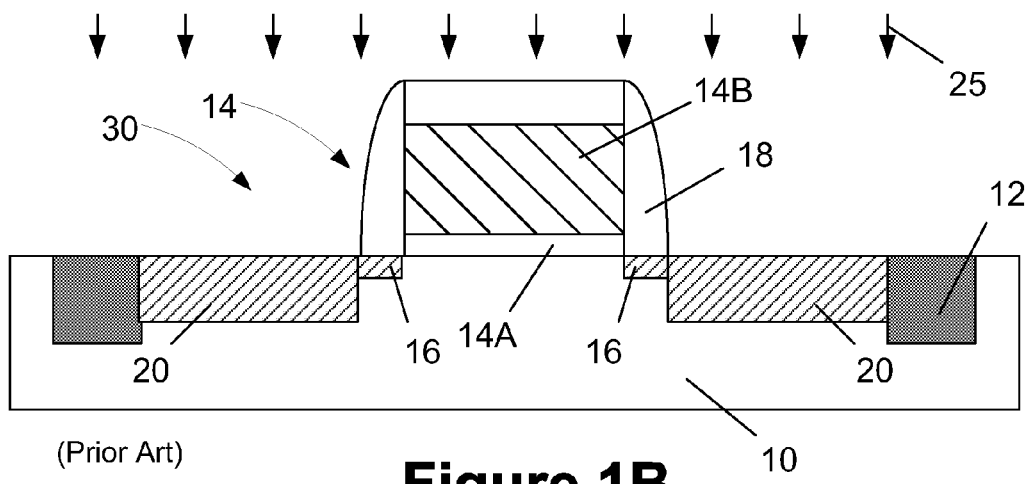
Figure 1C:
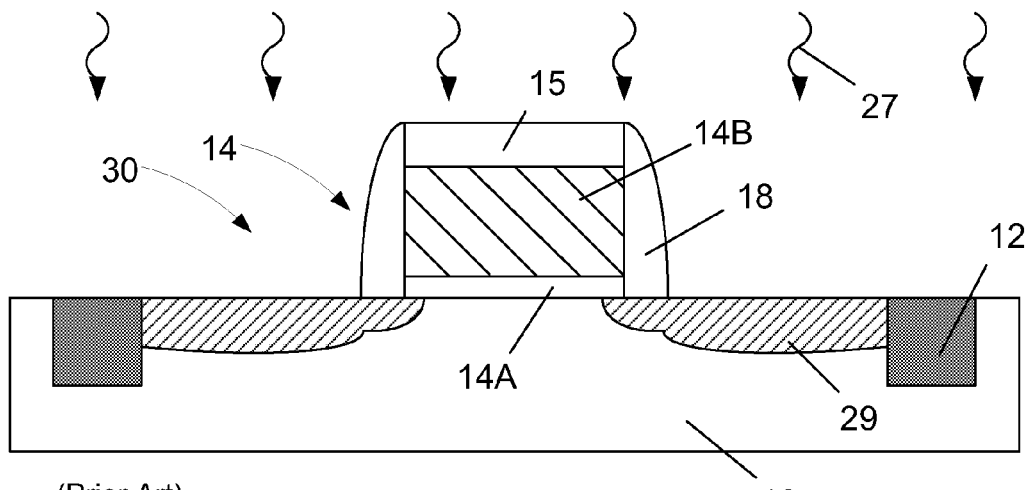

FIG. 3A depicts the illustrative NMOS transistor 100 at an early stage of fabrication, wherein the gate electrode structure 101 has been formed above the semiconducting substrate 103. The gate electrode structure 101 typically includes a gate insulation layer 101A and a conductive gate electrode 101B. An illustrative gate cap layer 115 is formed above the gate electrode 101B, and illustrative sidewall spacers 118 are also formed proximate the gate electrode structure 101, just as described above with reference to FIGS. 1A-1C. Illustrative extension implant regions 102 and deep source-drain implant regions 104 that have been formed in the substrate 103 are also depicted in FIG. 3A.

The substrate 103 may have a variety of configurations, such as the depicted bulk silicon configuration. The substrate 103 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 103 may also be made of materials other than silicon. As will be recognized by those skilled in the art after a complete reading of the present application, the gate electrode structure 101 may be of any desired construction and comprised of any of a variety of different materials, such as one or more conductive layers made of polysilicon or a metal, etc., and one or more layers of insulating material, such as silicon dioxide, a high-k material, etc. Additionally, the gate electrode structure 101 for the illustrative NMOS transistor 101 may have different material combinations as compared to a gate electrode structure for a PMOS transistor (not shown). Thus, the particular details of construction of gate electrode structure 101, and the manner in which the gate electrode structure 101 is formed, should not be considered a limitation of the present invention. For example, the gate electrode structure 101 may be made using so-called "gate-first" or "gate-last" techniques.

To arrive at the structure depicted in FIG. 3A, the gate electrode structure 101 and the gate cap layer 115 are typically formed by depositing various layers of material and performing one or more etching processes to define the basic stack of materials shown in FIG. 3A. Thereafter, an initial ion implantation process performed with an N-type dopant, e.g., arsenic, phosphorous, etc., to form the extension implant regions 102 in the substrate 103. Other implant regions, such as so-called halo implant regions (not shown) have also be previously formed in the substrate 103 at the point of fabrication depicted in FIG. 3A. Then, the sidewall spacers 118 are formed proximate the gate electrode structure 101 by depositing a layer of spacer material and thereafter performing an anisotropic etching process. Thereafter, a second ion implantation process is then performed with an N-type dopant, e.g., arsenic, phosphorous, etc., to form the so-called deep source-drain implant regions 104 in the substrate 103. The ion implantation process performed to form the deep source-drain implant regions 104 is typically performed using a higher dopant dose and it is performed at higher implant energy than the ion implantation process that was performed to form the extension implant regions 102. A layer 106 of, for example, amorphous carbon is then deposited above the transistor 100. The layer 106 may be formed by performing, for example, a conformal chemical vapor deposition process. The thickness of the layer 106 may vary depending upon the particular application. In one illustrative example, the layer 106 is a layer of amorphous carbon having a thickness ranging from about 10-20 nm.

Next, as shown in FIG. 3B, an ion implantation process 110 is performed to drive carbon atoms in the layer 106 into the substrate 103 define a silicon-carbon region 110R. The ion implantation process 110 is typically performed at a relatively high energy level using relatively large atoms, such as inert germanium or xenon atoms, etc. The relatively larger atoms collide with the carbon atoms in the layer 106 and dislodge a sufficient quantity of the carbon atoms from the layer 106 with imparting sufficient energy to the dislodged carbon atoms so that they are driven into the substrate 103. The quantity and depth of penetration of the dislodge carbon atoms may vary depending upon a variety of factors, such as the device under construction, the dopant dose and the implant energy used in the implantation process 110. In this illustrative example, the implantation process 110 was performed using germanium at a dopant dose of $1\ e^{15}$-$1\ e^{16}$ ions/cm$^2$ and at an energy level of about 40-50 keV. In this illustrative example, the dislodged carbon atoms penetrated into the substrate 103 to a depth of about 5-20 nm. Using the novel techniques described herein, the concentration of the carbon atoms in silicon-carbon region 110R may be as high as approximately 10%, a significant improvement over the prior art techniques described in the background section of the application.

Thereafter, as shown in FIG. 3C, a heating or anneal process, e.g., a laser anneal or a flash anneal, is performed at a temperature of about 1200 C for a duration of about 5-10 milliseconds minutes to form the final source-drain regions 120 (comprised of silicon-carbide material) for the transistor 100. This heating process repairs the damage to the lattice structure of the substrate 103 as a result of the various implantation processes described above and it activates the implanted N-type dopant materials. The implanted position of silicon-carbon region 110R is depicted in dashed lines in FIG. 3C.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a layer of amorphous carbon above a surface of a semiconducting substrate comprising a plurality of N-doped regions; and
performing an ion implantation process on said layer of amorphous carbon to dislodge carbon atoms from said layer of amorphous carbon and to drive said dislodged carbon atoms into said N-doped regions in said substrate.

2. The method of claim 1, wherein said ion implantation process is performed with at least one of germanium ions or xenon ions.

3. The method of claim 2, wherein said ion implantation process is performed at a dopant dose of $1e^{15}$-$1e^{16}$ ions/cm$^2$ and at an energy level of about 40-50 keV.

4. The method of claim 1, further comprising performing an anneal process on said substrate for a duration of 5-10 milliseconds at a temperature of at least 1200° C.

5. The method of claim 4, wherein said layer of amorphous carbon is removed from above said N-doped regions prior to performing said anneal process.

6. The method of claim 1, wherein said dislodged carbon atoms are driven into said substrate to a depth that ranges from 5-20 nm.

7. The method of claim 1, wherein, after performing said ion implantation process, a concentration of carbon atoms in said N-doped regions is in the range of approximately 2-10%.

8. A method, comprising:
forming a layer of amorphous carbon above a plurality of N-doped regions formed in a semiconducting substrate;
performing an ion implantation process on said layer of amorphous carbon to dislodge carbon atoms from said layer of amorphous carbon and to drive said dislodged carbon atoms into said plurality of N-doped regions; and
performing an anneal process on said substrate to form final source/drain regions for an NMOS transistor, said source/drain regions comprising a silicon-carbon material.

9. The method of claim 8, wherein said ion implantation process is performed at a dopant dose of $1e^{15}$-$1e^{16}$ ions/cm$^2$ and at an energy level of about 40-50 keV.

10. The method of claim 9, wherein said dislodged carbon atoms are driven into said plurality of N-doped regions to a depth that ranges from 5-20 nm.

11. The method of claim 10, wherein said ion implantation process is performed with at least one of germanium ions or xenon ions.

12. The method of claim 8, further comprising performing an anneal process on said substrate for a duration of 5-10 milliseconds at a temperature of at least 1200° C.

13. The method of claim 8, wherein, after performing said ion implantation process, a concentration of carbon atoms in said N-doped regions is in the range of approximately 2-10%.

14. A method, comprising:
forming a gate electrode structure for an NMOS transistor above a surface of semiconducting substrate;
forming a plurality of N-doped implant regions in said substrate proximate said gate electrode structure;
forming a layer of amorphous carbon above said N-doped regions in said semiconducting substrate; and
performing an ion implantation process on said layer of amorphous carbon to dislodge carbon atoms from said layer of amorphous carbon and to drive said dislodged carbon atoms into said N-doped regions in said substrate.

15. The method of claim 14, wherein said ion implantation process is performed with at least one of germanium ions or xenon ions.

16. The method of claim 15, wherein said ion implantation process is performed at a dopant dose of $1e^{15}$-$1e^{16}$ ions/cm$^2$ and at an energy level of about 40-50 keV.

17. The method of claim 14, further comprising performing an anneal process on said substrate for a duration of 5-10 milliseconds at a temperature of at least 1200° C.

18. The method of claim 17, wherein said layer of amorphous carbon is removed from above said N-doped regions prior to performing said anneal process.

19. The method of claim 14, wherein said dislodged carbon atoms are driven into said substrate to a depth that ranges from 5-20 nm.

20. The method of claim 14, wherein, after performing said ion implantation process, a concentration of carbon atoms in said N-doped regions is in the range of approximately 2-10%.

* * * * *